US012166500B2

(12) United States Patent
Viswanathan et al.

(10) Patent No.: US 12,166,500 B2
(45) Date of Patent: *Dec. 10, 2024

(54) AUXILIARY ADC-BASED CALIBRATION FOR NON-LINEARITY CORRECTION OF ADC

(71) Applicant: Texas Instruments Incorporated, Dallas, TX (US)

(72) Inventors: Nagarajan Viswanathan, Bangalore (IN); Himanshu Varshney, Bangalore (IN); Vinam Arora, Bangalore (IN); Charls Babu, Bangalore (IN); Srinivas Kumar Naru, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/461,152

(22) Filed: Sep. 5, 2023

(65) Prior Publication Data

US 2023/0412186 A1    Dec. 21, 2023

Related U.S. Application Data

(63) Continuation of application No. 17/589,533, filed on Jan. 31, 2022, now Pat. No. 11,784,660.

(30) Foreign Application Priority Data

Sep. 8, 2021  (IN) .............................. 202141040667

(51) Int. Cl.
*H03M 1/10* (2006.01)
*H03M 1/36* (2006.01)
*H03M 1/50* (2006.01)

(52) U.S. Cl.
CPC ......... *H03M 1/502* (2013.01); *H03M 1/1009* (2013.01); *H03M 1/362* (2013.01)

(58) Field of Classification Search
CPC ..... H03M 1/502; H03M 1/1009; H03M 1/362
(Continued)

(56) References Cited

U.S. PATENT DOCUMENTS 6,590,517 B1    7/2003  Swanson
8,730,072 B2 *  5/2014  Petigny .................. H03M 1/10
                                                     341/120
(Continued)

FOREIGN PATENT DOCUMENTS

DE    2912925 A1    10/1980
EP    0460840 A2    12/1991

OTHER PUBLICATIONS

European Search Report, Application No. 22194726.0, dated Feb. 8, 2023, 6 pages.

(Continued)

*Primary Examiner* — Jean B Jeanglaude
(74) *Attorney, Agent, or Firm* — Valerie M. Davis; Frank D. Cimino (57) ABSTRACT

In an example, a system includes an input channel and a voltage to delay converter (V2D) coupled to the input channel. The system also includes a first multiplexer coupled to the V2D and an analog-to-digital converter (ADC) coupled to the first multiplexer. The system includes a second multiplexer coupled to the input channel and an auxiliary ADC coupled to the second multiplexer. The system includes calibration circuitry coupled to an output of the auxiliary ADC, where the calibration circuitry is configured to correct a non-linearity in a signal provided by the input channel. The calibration circuitry is also configured to determine the non-linearity of the signal provided to the ADC relative to the signal provided to the auxiliary ADC.

20 Claims, 7 Drawing Sheets

(58) Field of Classification Search
USPC .......................................................... 341/120
See application file for complete search history.

(56) References Cited

U.S. PATENT DOCUMENTS

| | | |
|---|---|---|
| 10,284,188 B1 | 5/2019 | Soundararajan |
| 10,673,452 B1 | 6/2020 | Soundararajan |
| 10,673,453 B1 | 6/2020 | Pentakota |
| 10,673,456 B1 | 6/2020 | Dusad |
| 11,038,516 B1 | 6/2021 | Azadet |
| 2017/0357219 A1 | 12/2017 | Chiu |

OTHER PUBLICATIONS

Time-Based All-Digital Technique for Analog Built-in Self-Test, IEEE Transactions on Very Large Scale Integration (VLSI) Systems, vol. 22, No. 2, Feb. 2014, 9 pages.
A Reconfigurable Time Multiplexed Multichannel ADC Model for Efficient Data Acquisition, 2020 International Conference on Computational Performance Evaluation (ComPE), North-Eastern Hill University, Shillong, Meghalaya, India. Jul. 2-4, 2020., 4 pages.

* cited by examiner

AUXILIARY ADC-BASED CALIBRATION FOR NON-LINEARITY CORRECTION OF ADC

CROSS-REFERENCE TO RELATED APPLICATIONS

The present application claims priority to U.S. patent application Ser. No. 17/589,533, filed Jan. 31, 2022, which claims priority to India Provisional Application No. 202141040667, filed Sep. 8, 2021 and titled "Auxiliary ADC Based Calibration for Non-Linearity Correction of ADC". The present application is related to U.S. patent application Ser. No. 17/568,972, which was filed Jan. 5, 2022, is titled "Calibration Scheme for a Non-Linear ADC," and is hereby incorporated herein by reference in its entirety. The present application is related to U.S. Pat. No. 10,673,456, which was filed May 13, 2019, is titled "Conversion and Folding Circuit for Delay-Based Analog-to-Digital Converter System," and is hereby incorporated herein by reference in its entirety. The present application is related to U.S. patent application Ser. No. 17/588,493, which was filed Jan. 31, 2022, is titled "Lookup Table for Non-Linear Systems," and is hereby incorporated herein by reference in its entirety.

BACKGROUND

Delay domain analog-to-digital converters (ADCs) convert analog signals to digital signals by implementing a delay in an input signal. The length of the delay is based on the magnitude of the voltage of the input signal. The delay cell that creates the delay is voltage-controlled and changes the length of the delay based on the magnitude of the voltage of the input signal. The delay time is then digitized by a time-to-digital converter.

SUMMARY

In accordance with at least one example of the description, a system includes an input channel and a voltage to delay converter (V2D) coupled to the input channel. The system also includes a first multiplexer coupled to the V2D and an analog-to-digital converter (ADC) coupled to the first multiplexer. The system includes a second multiplexer coupled to the input channel and an auxiliary ADC coupled to the second multiplexer. The system includes calibration circuitry coupled to an output of the auxiliary ADC, where the calibration circuitry is configured to correct a non-linearity in a signal provided by the input channel. The calibration circuitry is also configured to determine the non-linearity of the signal provided to the ADC relative to the signal provided to the auxiliary ADC.

In accordance with at least one example of the description, a method includes providing a signal on an input channel to a V2D, where the V2D provides the signal to a multiplexer, and where the multiplexer provides the signal to an ADC. The method also includes calibrating the signal by comparing an output of the ADC to a code provided by a digital-to-analog converter (DAC) and storing a result of the comparison in a look-up table (LUT). The method includes providing the signal to an auxiliary ADC, where the auxiliary ADC provides a reference signal to calibration circuitry. The method also includes estimating a non-linearity of the signal by comparing the output of the ADC to the reference signal. The method includes updating the LUT based at least in part on the non-linearity.

In accordance with at least one example of the description, a method includes providing an input signal to an ADC via a first signal path. The method also includes providing the input signal to an auxiliary ADC via a second signal path. The method includes determining a non-linearity between the first signal path and the second signal path by determining a linear error between the first signal path and the second signal path, and by determining a non-linear error between the first signal path and the second signal path based at least in part on the linear error. The method also includes updating a LUT value based at least in part on the non-linear error. The method includes providing an output signal from the LUT based at least in part on the input signal and the value in the LUT.

BRIEF DESCRIPTION OF THE DRAWINGS

The same reference numbers or other reference designators are used in the drawings to designate the same or similar (functionally and/or structurally) features.

DETAILED DESCRIPTION

Delay domain ADCs are fast and efficient, but may exhibit non-linear behavior. A delay-based ADC includes a voltage-to-delay converter (V2D) followed by a delay-resolving backend ADC (such as the circuits/systems described in U.S. Pat. Nos. 10,284,188, 10,673,456, 10,673,452 and 10,673,453, all of which are incorporated by reference in their entirety). Delay domain ADCs may have multiple stages, with each stage having a comparator and a delay. The delay should be calibrated to achieve optimal gain (the term "gain" may be voltage gain, current gain and/or delay gain—where delay gain may mean the amount of delay through a circuit based on a voltage or voltage difference at the input of the circuit). To fix the non-linearity of the ADC, a calibration path may be implemented in parallel with functional paths of the ADCs. In the calibration path, an on-chip digital-to-analog converter (DAC) fills look-up tables (LUTs) with calibration data that maps the non-linear ADC output to a linear code. The possible DAC codes are transmitted through the ADCs, and for each DAC code the ADC outputs are analyzed and compared to the expected output. A LUT for each ADC is updated to correctly convert each DAC code to the proper value for each ADC. With this approach, the chip may have one DAC that trains the multiple ADCs. However, the performance of the system is limited by non-linearity mismatches between the calibration path and the functional path of the ADCs.

In examples herein, an on-chip successive-approximation-register (SAR) ADC (the "auxiliary ADC," described below) estimates integral non-linearities (INLs) of a bank of delay-domain ADCs. INLs are a measure of the deviation between the ideal input threshold value and the measured threshold level of a certain output code. After estimating the INLs, the LUT data for each ADC is modified using these estimates to correct for the INLs. A calibration path includes a DAC and a V2D. Each input channel includes a V2D, an ADC, and a LUT, referred to as a functional path. Also, each input channel is provided to the SAR ADC via a reference path. The input channels share the SAR ADC in the reference path. A calibration processor is coupled to the SAR ADC and the LUTs. The calibration processor may be any suitable calibration circuitry or logic (including, but not limited to, a processor, state machine, application specific integrated circuit, logic circuitry, analog circuitry, memory and/or software). The calibration processor triggers the SAR ADC and reads the output of the SAR ADC. The calibration processor also receives samples from the input channels via the LUT. Using these samples and other information described below, the calibration processor determines the non-linearities in the functional path of each ADC. The calibration processor then inverts the non-linearities and updates the LUT to correct for the non-linearities.

In examples herein, performance of the ADCs may be improved. Performance may be measured by spurs, which are interfering frequency components that are found in the signal chain. Performance may also be measured by spurious-free dynamic range (SFDR), which is the strength ratio of the fundamental signal to the strongest spurious signal in the output. Performance may be measured by harmonic distortion values as well. The SAR ADC consumes negligible power in an example. The additional area requirements and power impact of the examples described herein are small.

Figure 1:
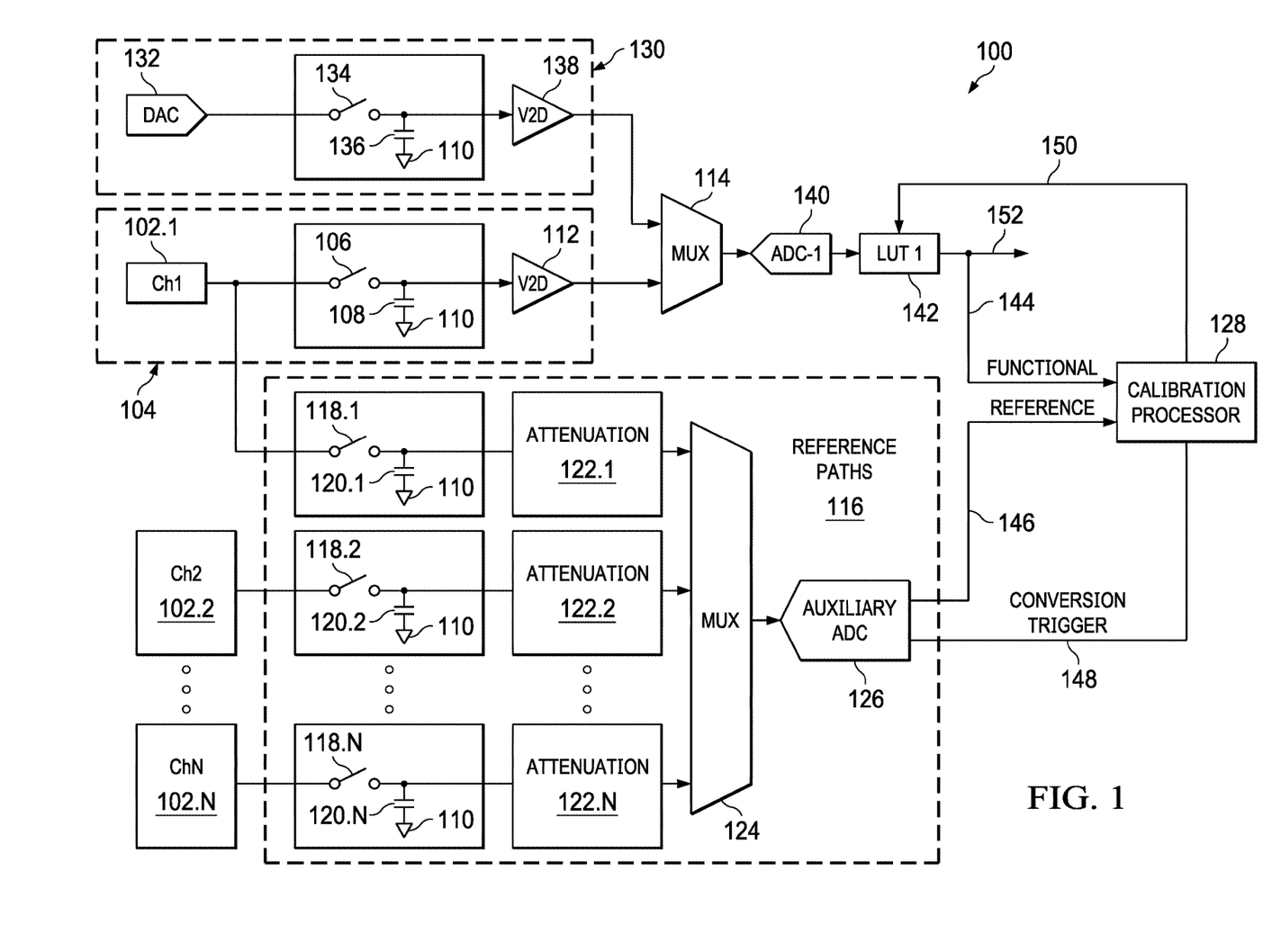
FIG. 1 is a schematic diagram of a system for auxiliary ADC-based calibration for non-linearity correction of ADCs in accordance with various examples.

FIG. 1 is a schematic diagram of a system 100 for auxiliary ADC-based calibration for non-linearity correction of ADCs in accordance with various examples herein. System 100 includes input channels 102.1, 102.2, . . . 102.N (collectively, input channels 102), which are also referred to as channel 1, channel 2, etc. Any number of input channels 102 may be present in examples. Each input channel 102 has an associated functional path 104. In FIG. 1, only one functional path 104 is shown, the functional path 104 for input channel 102.1. However, each input channel 102 (e.g., 102.2, 102.N, etc.) also has a functional path 104 that is similar to the functional path 104 shown. These additional functional paths 104 are omitted from FIG. 1 for simplicity. Functional path 104 includes a switch 106 and a capacitor 108 coupled to a common potential (e.g., ground) 110. Functional path 104 also includes a V2D 112. An output of V2D 112 is coupled to multiplexer 114.

System 100 also includes reference paths 116. Each input channel 102 has a reference path, referred to collectively as reference paths 116. Reference paths 116 shows the combined reference paths for all of the input channels 102. Each reference path 116 includes a switch 118, a capacitor 120, and attenuation 122, which may attenuate the amplitude in one example. As one example, the reference path for channel 102.1 includes switch 118.1, capacitor 120.1, and attenuation 122.1. The reference path for channel 102.2 includes switch 118.2, capacitor 120.2, and attenuation 122.2. The reference path for channel 102.N includes switch 118.N, capacitor 120.N, and attenuation 122.N. In this example, multiplexer 124 and ADC 126 are also shown as components of reference paths 116. The reference path for each channel 102 is provided to inputs of multiplexer 124, and an output of multiplexer 124 is provided to auxiliary ADC 126 (e.g., an SAR ADC). Attenuation 122 is any attenuator or other circuitry that attenuates a signal to improve linearity of the reference paths 116. Auxiliary ADC 126 is a voltage domain ADC. An output of auxiliary ADC 126 is provided to calibration processor 128 via path 146 (which may be a multiconductor bus, a single conductor or any other conductor). Calibration processor 128 may include more than one processor or processor cores in some examples. Calibration processor 128 may be any calibration circuitry or calibration logic in other examples. The calibration circuitry or calibration logic may include any suitable hardware or software to perform the tasks described herein.

A SAR ADC is a type of ADC that converts a continuous analog waveform into a discrete digital representation using a binary search through all possible quantization levels before finally converging upon a digital output for each conversion. A SAR ADC may be a linear ADC. A SAR ADC may be slower than other types of ADCs but may also provide greater accuracy. In some examples, a SAR ADC may not have the non-linearities that are found in other types of ADCs.

System 100 also includes a calibration path 130. Calibration path 130 includes a DAC 132, switch 134, capacitor 136, and V2D 138. An output of V2D 138 is provided to multiplexer 114. An output of multiplexer 114 is provided to ADC 140. An output of ADC 140 is provided to LUT 142. As described above, each input channel 102 has an associated ADC 140 and LUT 142, Each input channel 102 may be provided to multiplexer 114, or each input channel may have a separate multiplexer 114 in some examples. Only one multiplexer 114, ADC 140, and LUT 142 are shown here for simplicity. Calibration processor 128 is coupled to LUT 142 so the calibration processor 128 can read from and write to LUT 142. Calibration processor 128 reads functional path 104 samples from LUT 142 via path 144. Calibration processor 128 reads reference path 116 samples from auxiliary ADC 126 via path 146. Calibration processor 128 triggers auxiliary ADC 126 via path 148. Calibration processor 128 writes to LUT 142 via path 150. An output of LUT 142 is shown as output 152 in system 100, which is provided to calibration processor 128 via path 144. The corrected output of system 100 may also be provided at output 152 after the operation of system 100. Switches 106, 118, and 134 select paths in various examples. Attenuation 122 may be useful for scaling signals in some examples.

Calibration path 130 operates as follows. All the possible codes of the DAC 132 are cycled through. For each DAC code, the output from ADC 140 is read by calibration processor 128. Calibration processor 128 compares this value to the expected output from ADC 140 for each specific DAC code. Then, calibration processor 128 may update the LUT so the correct conversion happens for each DAC code. With this approach, one DAC 132 provides calibration for multiple ADCs 140. DAC 132 trains the ADCs 140. Multiplexer 114 chooses between the output of calibration path 130 and functional path 104. In this examples, input samples on the input channels 102 are in the voltage domain, and V2D 112 converts the voltage domain to the delay domain. Calibration path 130 also has a V2D 138, which is different than the V2D 112 in the functional path 104. These different V2Ds may cause some of the non-linearities that are corrected via the examples herein. Additionally, different voltages, temperatures, and process variations across components may cause non-linearities in some examples.

In operation, calibration processor 128 corrects non-linearities in the functional paths 104 of the ADCs 140. Calibration processor 128 reads samples from auxiliary ADC 126 as a reference. Sampled data from the reference paths 116 via auxiliary ADC 126 is useful for estimating errors in the same sampled data from the functional paths 104. As described below, calibration processor 128 collects the samples and additional information to determine the non-linearities. In some examples, there may be a timing mismatch between the two samples. The samples on the input channels 102 may have a memory associated with them, and the memory may be different on the functional path 104 and the reference path 116. To account for this, two additional pieces of data are sent to calibration processor 128. The first piece of data is the time derivative of the ADC 140 output corresponding to the exact sample time. The second piece of data is the sample that is one sample time period previous to the triggered sample (e.g., a previous input signal). Therefore, if a sample is triggered at time t, calibration processor 128 collects the auxiliary ADC 126 sample at time t, the LUT 142 sample corresponding to the input sample at time t, the derivative of the functional path 104 output at the sample that corresponds to time t, and the sample that is one time period before time t. The algorithms for determining the non-linearities using this collected information are described below.

Figure 2:
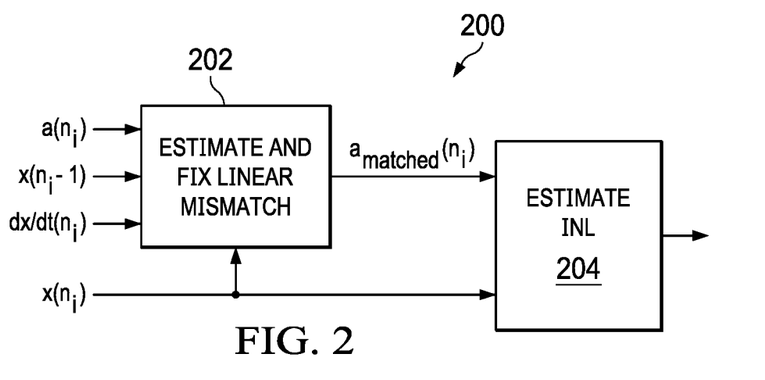
FIG. 2 is a block diagram of variables for algorithms that determine non-linearities in accordance with various examples.

FIG. 2 is a block diagram 200 of the variables for the algorithms that determine non-linearities in accordance with various examples herein. The steps of the algorithms for determining non-linearities are described below. The contents of FIG. 2 are described with concurrent reference to FIG. 1. Calibration processor 128 first estimates and corrects linear mismatch (block 202), and then estimates the non-linearities (block 204). A number of variables are used by the algorithms. First, $a(n_i)$ is the auxiliary ADC 126 output for a sample i. Second, $x(n_i)$ is the LUT 142 output. Third, $x(n_i-1)$ is the functional path output (e.g., the LUT 142 output) from the previous time period (e.g., corresponding to the previous sample). Fourth, $dx/dt(n_i)$ is the time derivative of the LUT 142 output. These variables are provided to block 202 to estimate and fix linear mismatch. In an example, these mismatches between the two paths (e.g., paths 104 and 116) are linear, so the two additional pieces of information (e.g., the time derivative dx/dt and the previous time period sample) may be useful to correct the mismatches. The mismatches may be caused by a slight difference in sampling times between the reference path 116 and the functional path 104, and by the slight differences in the memory (e.g., retention of a previous value due to parasitics or other electrical phenomena, such as long conductor lengths, switching times, etc.) of the two samples.

The error "e" between the functional path 104 output "x" and the reference path 116 output "a" is e=x−a. However, the mismatches described above should be accounted for, as well as a potential gain mismatch between the paths 104 and 116. Equation (1) models the non-linear error for the $i^{th}$ sample:

$$e(i) = \left[ g \cdot a(n_i) + \alpha_{mem} \cdot x(n_i - 1) + \Delta t \cdot \frac{dx}{dt}(n_i) + c \right] - x(n_i) \quad (1)$$

In Equation 1, the non-linear error e(i) equals the gain g (of the reference path) times the reference path 116 output $a(n_i)$, plus the memory $\alpha_{mem}$ times the previous functional path 104 output ($x(n_i-1)$), plus the time derivative dx/dt of the functional path 104 output ($n_i$), plus an offset c (discussed in more detail below), minus the functional path output($x(n_i)$). Therefore, e(i) is the non-linear error that is computed by calibration processor 128.

Calibration processor 128 performs two functions. The first is to find the values g, $\alpha_{mem}$, $\Delta t$, and c. These value may be determined for each channel in an example. The second function is to use the error values to find the non-linearities between the reference path 116 and the functional path 104 for a given ADC 140. In one example, the derivative dx/dt is calculated with hardware within calibration processor 128 that has a filter that acts as a differentiator. In other examples, other techniques may be used to calculate the derivative.

FIG. 2 shows the estimation of the error between the functional path 104 and the reference path 116 broken into two sub-problems. The first problem is to estimate and remove the linear mismatch, as shown in block 202. The second problem is to estimate the INL in block 204. The first problem is discussed with respect to FIG. 3 below.

Figure 3:
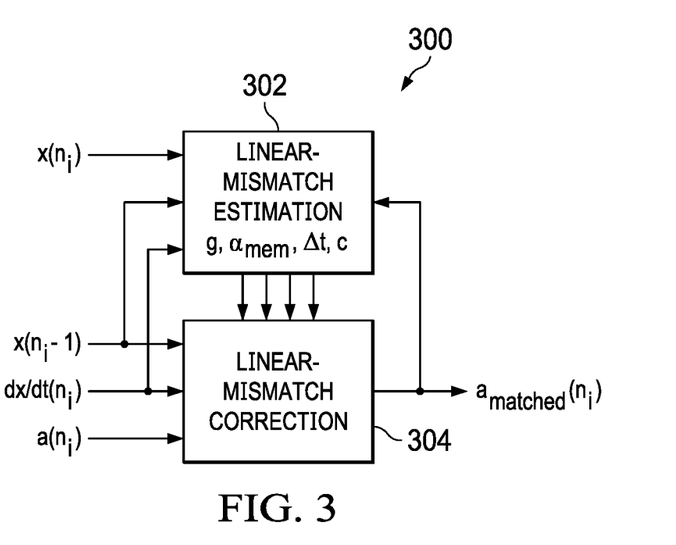
FIG. 3 is a block diagram of variables for linear mismatch estimation and correction in accordance with various examples.

FIG. 3 is a block diagram 300 of the variables for linear mismatch estimation and correction in accordance with various examples herein. In some examples, a model for linear mismatch has three signal dependent components. With a single tone input, an example model may solve for two components. With a multitone input, a model may solve for three components. In an example herein, potential divergence of the solution may be found based on condition number (described below). As described below, if the condition number is greater than a threshold, an algorithm freezes the $\Delta t$ value and solves the equation for another variable. Block diagram 300, which incorporate a feedback loop, includes linear mismatch estimation 302 and linear mismatch correction 304. In an example, linear mismatch estimation 302 and linear mismatch correction 304 may be performed as a part of block 202 of FIG. 2. To find the linear mismatch, the error from Equation 1 is assumed to be zero. Therefore, Equation (2) is the result:

$$x(n_i) = g \cdot a(n_i) + \alpha_{mem} \cdot x(n_i - 1) + \Delta t \cdot \frac{dx}{dt}(n_i) + c \quad (2)$$

In an example, $x(n_i)$ can be renamed as $a_{matched}(n_i)$ (e.g., linearly matched). Therefore, the error equals x minus $a_{matched}$ (e=x−$a_{matched}$). A least mean square (LMS) algorithm may be useful for solving for the values g, $\alpha_{mem}$, $\Delta t$, and c in one example. Other algorithms may be used in other examples. In an example, samples may be collected and accumulated in a matrix. In one example, the matrix is a mismatch matrix that includes cross correlations. As shown in Equation (3):

$$A_{MM} \cdot \vec{x}_{MM} = \vec{b}_{MM} \quad (3)$$

$A_{mm}$ is the correlation matrix between $$a(n_i), x(n_i - 1), \frac{dx}{dt}(n_i).$$

Variable $b_{mm}$ is the correlation matrix between $$x(n_i) \text{ and } a(n_i), x(n_i-1), \frac{dx}{dt}(n_i).$$

After enough samples are collected (such as 64,000 in one example, via a feedback accumulation loop), the matrix is inverted to get $\vec{x}_{mm}=[\hat{g},\hat{\alpha}_{mem}, \Delta t]$. Correlation means that the mean should be subtracted as well. Before executing a mean square error (MSE) fit, the means of the data streams are subtracted to get the correlation matrix equation. After the matrix is inverted, Equation (4) results:

$$a_{matched}(n_i) = \hat{g} \cdot a(n_i) + \hat{\alpha}_{mem} \cdot x(n_i-1), +\hat{\Delta}t \cdot \frac{dx}{dt}(n_i) + c \quad (4)$$

The constant c is not found using this method in this example. The constant c is found after the other variables are determined. With these techniques, both $\alpha_{mem}$ and $\Delta t$ cannot be estimated. Therefore, the condition number $\kappa$ of the matrix $A_{mm}$ is useful. The condition number $\kappa$ of a function measures how much the output value of the function can change for a small change in the input. The condition number $\kappa$ is useful for measuring how sensitive a function is to changes or errors in the input, and how much error in the output results from an error in the input. In this example, if the condition number $\kappa$ of the mismatch matrix $A_{mm}$ is greater than a threshold $\kappa_{thres}$, then there is not enough information to find both terms $\alpha_{mem}$ and $\Delta t$, so only one term is determined. If the condition number $\kappa$ is less than the threshold $\kappa_{thres}$, the matrix inverse is computed and both terms are determined. In this example, the condition number $\kappa$ is indicative of the signal amplitude if the constant offset c is removed. The matrix does not have the offset c, and therefore the matrix only has signal power as the parameter. The condition number $\kappa$ is independent of signal amplitude, which allows the threshold of the condition number $\kappa$ to be constant. In an example, the condition number threshold $\kappa_{thres}$ is found empirically, based on the stability of the loop. The threshold $\kappa_{thres}$ could be calculated in another example.

After the calculations described above are performed, the calculations represented by linear mismatch estimation 302 and linear mismatch correction 304 are complete. The result is $a_{matched}(n_i)$. Next, $a_{matched}(n_i)$ may be compared to the output from LUT 142 to find the non-linearity.

The non-linear error e(i) for the $i^{th}$ sample is found with Equation (1) above. However, to find e(i), a basis should be selected. The basis may be selected based on the kind of distortion that is to be corrected. Any suitable basis may be used in the examples herein. In some examples, a power series basis may be used. In some power series, higher order coefficients may be sensitive to input amplitude. Therefore, in another example, B-splines (basis splines) may be useful as a basis function. B-splines are spline functions (e.g., functions defined piecewise by polynomials). A B-spline of order n is a piecewise polynomial function of degree n−1 in a variable x. The B-spline is defined over 1+n locations $t_j$, which are called knots or breakpoints, and which must be in non-descending order. The B-spline contributes only in the range between the first and last of these knots and is zero elsewhere. The B-splines may be weighted by a constant w in this example. Any suitable number of zones for the B-splines may be used in examples herein. The number of zones chosen may be based on the detail required in the INL estimate. A higher number of zones means higher detail, but also increases computation cost. In one example herein, 32 zones are selected. Also, $2^{nd}$-order B-splines are used in an example. Higher order B-splines may be useful, but may also increase computational complexity. Second-order B-splines approximate the INL as a $2^{nd}$ order piecewise polynomial.

After the non-linear error is computed, there may be a linear component that remains. This linear component represents some residual gain and offset left between the reference path and functional path. This component shows up as a non-linearity and may vary over time due to temperature variations and other variations. This offset and gain is found and removed in examples herein. To remove it, a first order line is fit through all the points in a graphed estimate of the error and subtracted. By using B-splines, only 32 points are fit and subtracted in one example. It is computationally easier to perform this step in the spline-weights domain rather than the INL domain. That is one advantage of using B-splines as described herein.

Figure 4:
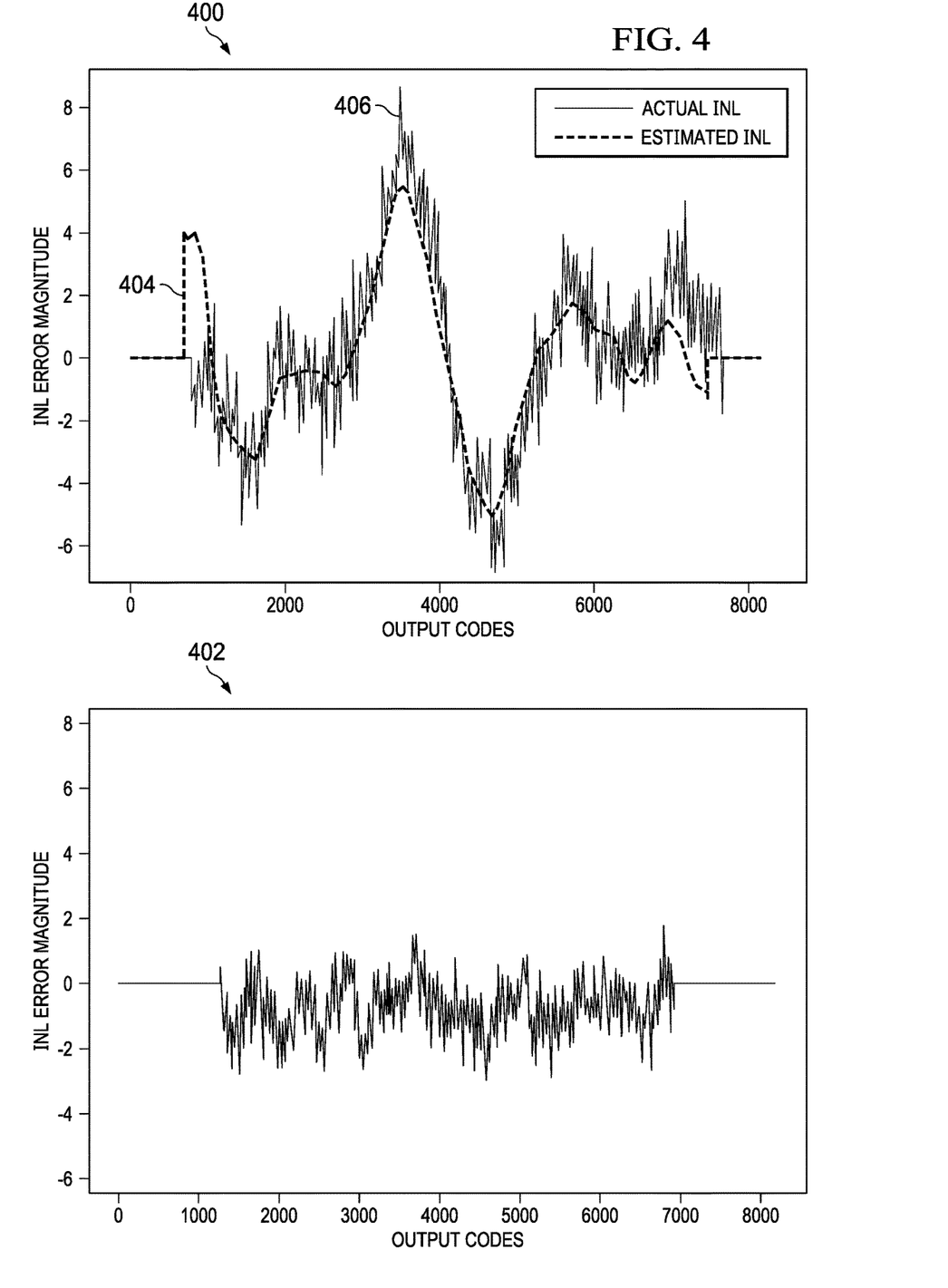
FIG. 4 is a collection of graphs showing magnitudes of non-linearity versus output codes in accordance with various examples.

FIG. 4 is a collection of graphs showing the magnitude of the non-linearity versus output codes in accordance with various examples herein. Graph 400 shows the actual INL and the estimated INL using the techniques described herein. Graph 402 shows the INL after the correction is applied to remove the INL. Graph 400 includes a curve 404 and a curve 406. Curve 404 is the estimated INL, and curve 406 is the actual INL. The y-axis represents the magnitude of the non-linearity, and the x-axis represents the DAC 132 output codes. Graph 400 shows that the examples described herein provide an estimated INL curve 404 that tracks relatively closely with the actual INL of curve 406. Graph 402 shows the INL that remains after the estimated INL curve 404 is subtracted from the actual INL of curve 406. As seen in graph 402, the remaining INL has a magnitude, in general, much smaller than the actual INL of curve 406 and roughly near the zero magnitude of the y-axis. As described above, this correction using the estimated INL curve 404 is applied via the LUT 142. Calibration processor 128 calculates the estimated INL and updates LUT 142 with corrected values that operate to remove the INL from the output of ADC 140. The corrected output is provided at output 152.

Figure 5:
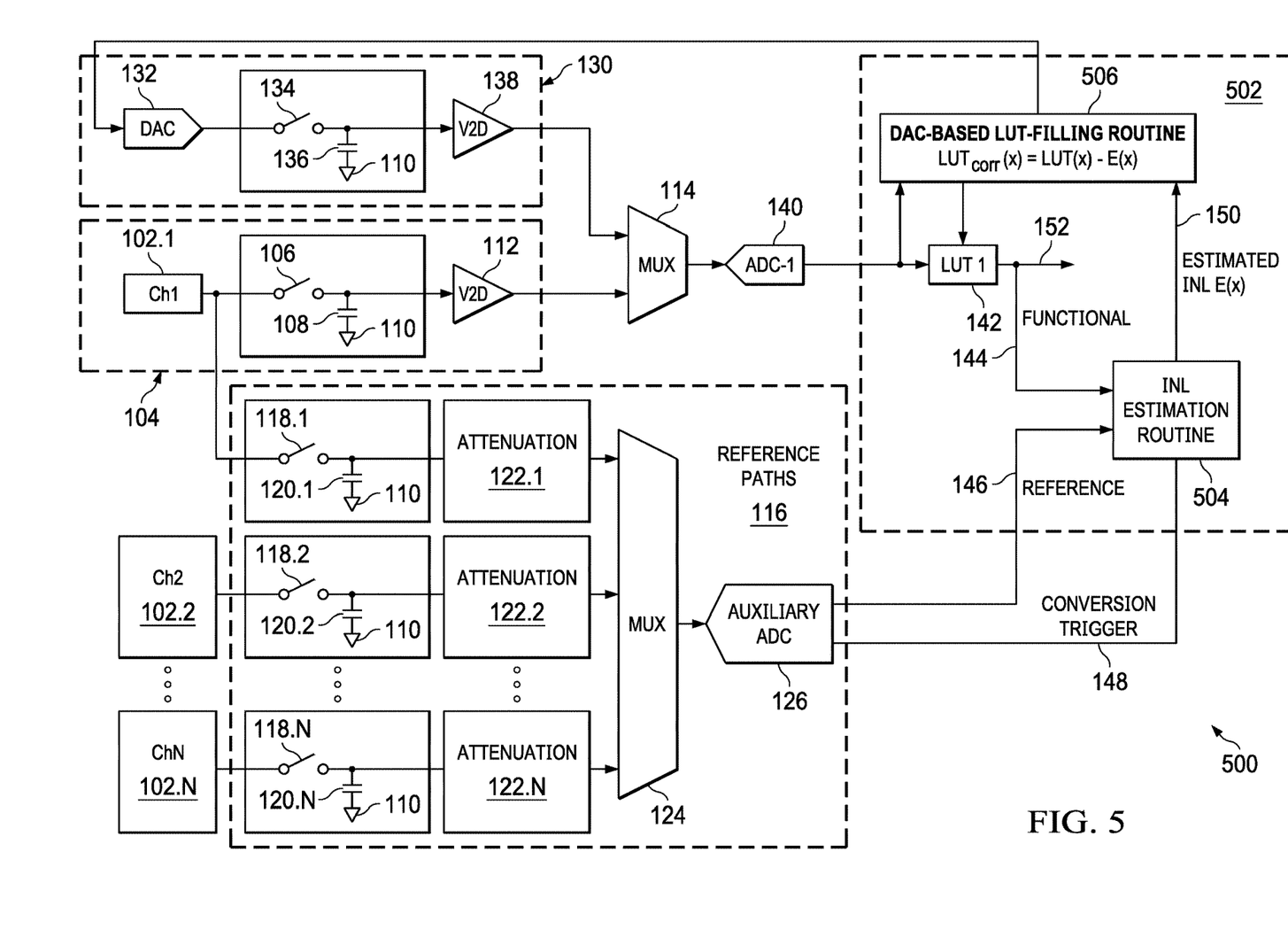
FIG. 5 is a schematic diagram of a system for auxiliary ADC-based calibration for non-linearity correction of ADCs in accordance with various examples.

FIG. 5 is a schematic diagram of system 500 for auxiliary ADC-based calibration for non-linearity correction of ADCs in accordance with various examples herein. In FIG. 5, the same reference numbers or other reference designators are used as in FIG. 1 to designate the same or similar (functionally and/or structurally) features. The structure and operation of many of the components of system 500 are described above with respect to FIG. 1, so a detailed explanation of the components of system 500 is omitted for simplicity. System 500 includes an INL correction feedback loop 502 along with the components described above with respect to FIG. 1.

INL correction feedback loop 502 includes an INL estimation routine 504 and a DAC-based LUT-filling routine 506. The INL estimation routine 504 is described above with respect to FIGS. 2 and 3. The INL estimation routine 504 is performed by calibration processor 128 in one example (not shown in FIG. 5). The INL estimation routine 504 receives functional path information along path 144, and receives reference path information along path 146. The INL estimation routine 504 may trigger auxiliary ADC 126 via path 148 as part of the routine, to collect reference path information from auxiliary ADC 126. After INL estimation routine 504 is complete, the estimated INL E(x) is provided to DAC-based LUT-filling routine 506 via path 150. The INL estimation routine may be performed for each channel in an example.

DAC-based LUT-filling routine 506 updates the LUT 142 using the estimated INL E(x) provided by INL estimation routine 504. The DAC-based LUT-filling routine 506 may be performed by calibration processor 128 in an example. In an example, the LUT is updated with Equation (5):

$$LUT_{corr}(x)=LUT(x)-E(x) \quad (5)$$

where $LUT_{corr}(x)$ is the updated value written to LUT 142, LUT(x) is the current value stored in LUT 142, and E(x) is the error provided by INL estimation routine 504. The DAC-based LUT-filling routine 506 may be performed for each channel in an example. After LUT 142 is updated, an output signal may be provided at output 152. The output signal is the input signal provided on the input channel 102 with a correction applied to it based on the value stored in LUT 142 (e.g., $LUT_{corr}(x)$). The value stored in LUT 142 may include a calibration correction, linear error correction, and non-linear error correction in an example.

Figure 6:
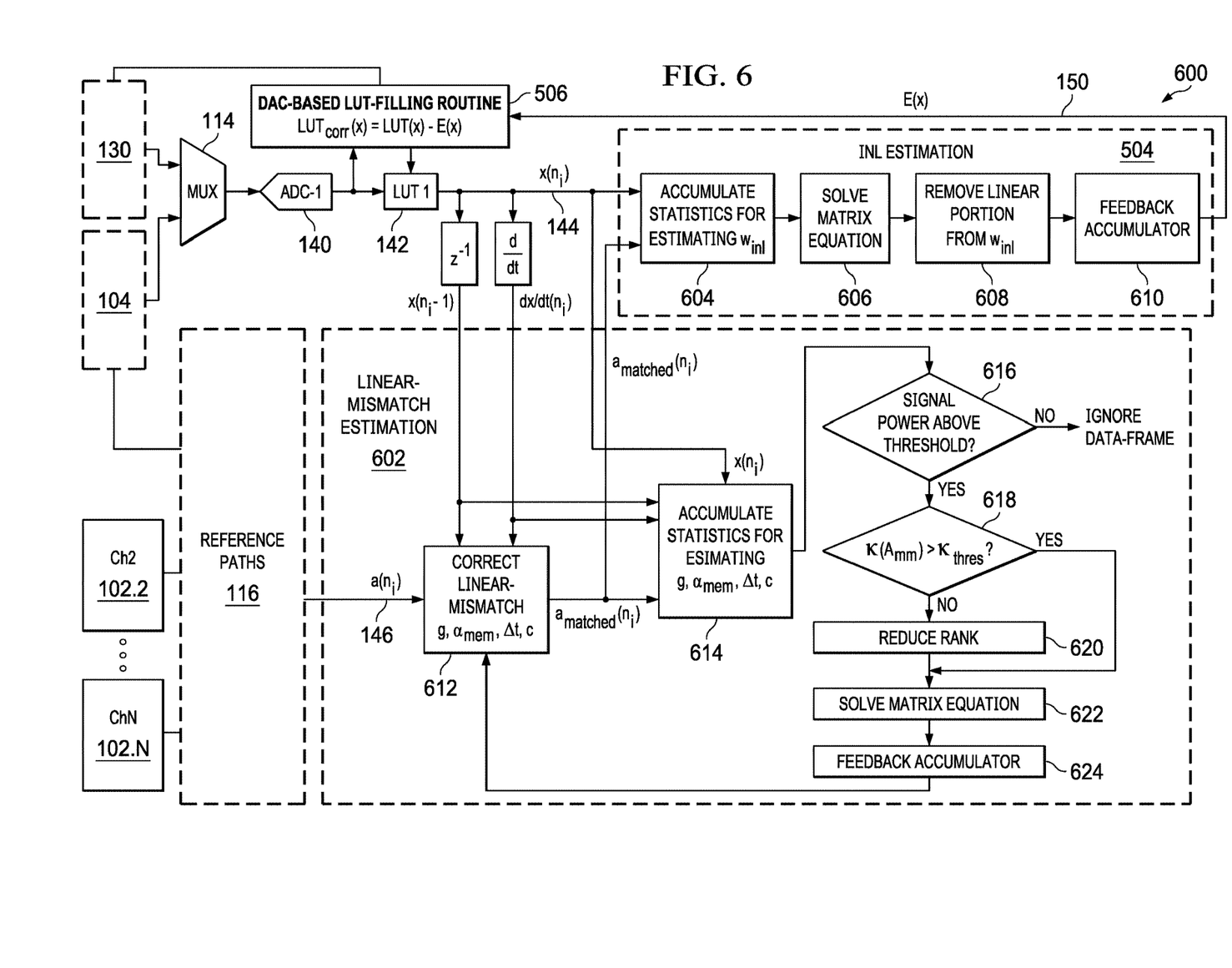
FIG. 6 is a schematic diagram of a system for auxiliary ADC-based calibration for non-linearity correction of ADCs in accordance with various examples.

FIG. 6 a schematic diagram of system 600 for auxiliary ADC-based calibration for non-linearity correction of ADCs in accordance with various examples herein. In FIG. 6, the same reference numbers or other reference designators are used as in FIGS. 1 and 5 to designate the same or similar (functionally and/or structurally) features. The structure and operation of many of the components of system 600 are described above with respect to FIGS. 1 and 5, so a detailed explanation of the components of system 600 is omitted for simplicity. System 600 includes the INL estimation routine 504, the DAC-based LUT-filling routine 506, and the linear-mismatch estimation 602. In an example, calibration processor 128 performs the INL estimation routine 504, the DAC-based LUT-filling routine 506, and the linear-mismatch estimation 602. Calibration processor 128 is not shown in FIG. 6 for simplicity.

DAC-based LUT-filling routine 506 operates as described above. The INL estimation routine 504 includes processes 604, 606, 608, and 610. INL estimation routine 504 receives inputs $x(n_i)$ and $a_{matched}(n_i)$ as shown in FIG. 2. At 604, INL estimation routine 504 accumulates statistics for estimating the spline weight $w_{inl}$. At 606, INL estimation routine 504 solves the matrix equation as described above with respect to FIG. 3. At 608, INL estimation routine 504 removes the linear portion of the error as described above. At 610, a feedback accumulator accumulates elements of the matrix equation as new data samples arrive, until enough samples are accumulated to invert the matrix and update the coefficients. The INL estimation routine 504 provides the estimated INL E(x) to DAC-based LUT-filling routine 506 via path 150 as described above with respect to FIG. 5.

Linear-mismatch estimation 602 operates as described above with respect to FIGS. 2 and 3. Linear-mismatch estimation 602 includes processes 612, 614, 616, 618, 620, 622, and 624. In an example, correct linear mismatch 612 (e.g., linear mismatch correction 304 described above) receives a sample $a(n_i)$ from auxiliary ADC 126, the previous sample $x(n_i-1)$, and the time derivative $dx/dt(n_i)$. Correct linear mismatch 612 produces $a_{matched}(n_i)$, which is provided to process 614. Process 614 accumulates statistics for estimating the values g, $\alpha_{mem}$, $\Delta t$, and c (e.g., linear mismatch estimation 302 described above). Inputs of process 614 are collected from correct linear mismatch 612 and path 144. Process 614 provides an output to process 616. At 616, a decision is made whether the signal power is above a threshold. If it is not, the data frame is ignored. If the signal power is above the threshold, process 618 determines is the condition number κ is above $κ_{thres}$. If not, the rank is reduced at process 620. If the condition number κ is above $κ_{thres}$, the process moves to process 622, where the matrix equation is solved as described above. At process 624, a feedback accumulator accumulates samples and provides them to correct linear mismatch 612, which completes the feedback loop.

Figure 7:
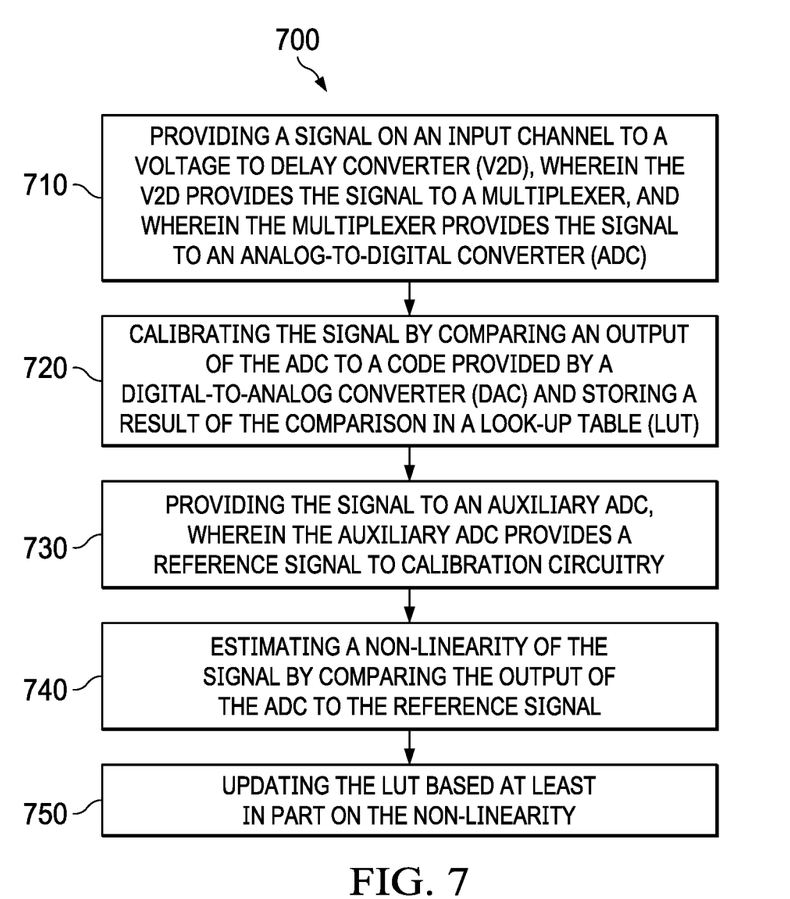
FIG. 7 is a flow diagram of a method for auxiliary ADC-based calibration for non-linearity correction of ADCs in accordance with various examples.

FIG. 7 is a flow diagram of a method 700 for auxiliary ADC-based calibration for non-linearity correction of ADCs in accordance with various examples herein. The steps of method 700 may be performed in any suitable order. The hardware components described above with respect to FIGS. 1-3 and 5-6 may perform method 700 in some examples.

Method 700 begins at 710, where an input channel provides a signal to a V2D, where the V2D provides the signal to a multiplexer, and where the multiplexer provides the signal to an ADC. As an example, channel 102.1 provides a signal to V2D 112, multiplexer 114, and ADC 140. This path may be referred to as a functional path for the input signal.

Method 700 continues at 720, where the signal is calibrated by comparing an output of the ADC to a code provided by a DAC (such as DAC 132) and storing a result of the comparison in an LUT, such as LUT 142. Calibration processor 128 or other calibration circuitry may perform the calibration in one example.

Method 700 continues at 730, where the input channel provides the signal to an auxiliary ADC, where the auxiliary ADC provides a reference signal to calibration circuitry. The auxiliary ADC may be auxiliary ADC 126 in an example, and the calibration circuitry may be calibration processor 128. In another example, a different processor or calibration circuitry may be useful.

Method 700 continues at 740, where calibration processor 128 (or other calibration circuitry) estimates a non-linearity of the signal by comparing the output of the ADC to the reference signal. The process for estimating the non-linearity is described above.

Method 700 continues at 750, where the calibration processor 128 (or other calibration circuitry) updates the LUT 142 based at least in part on the non-linearity. LUT 142 may be updated as described above with respect to FIG. 5. In other examples, any suitable method may be useful for updating LUT 142.

Figure 8:
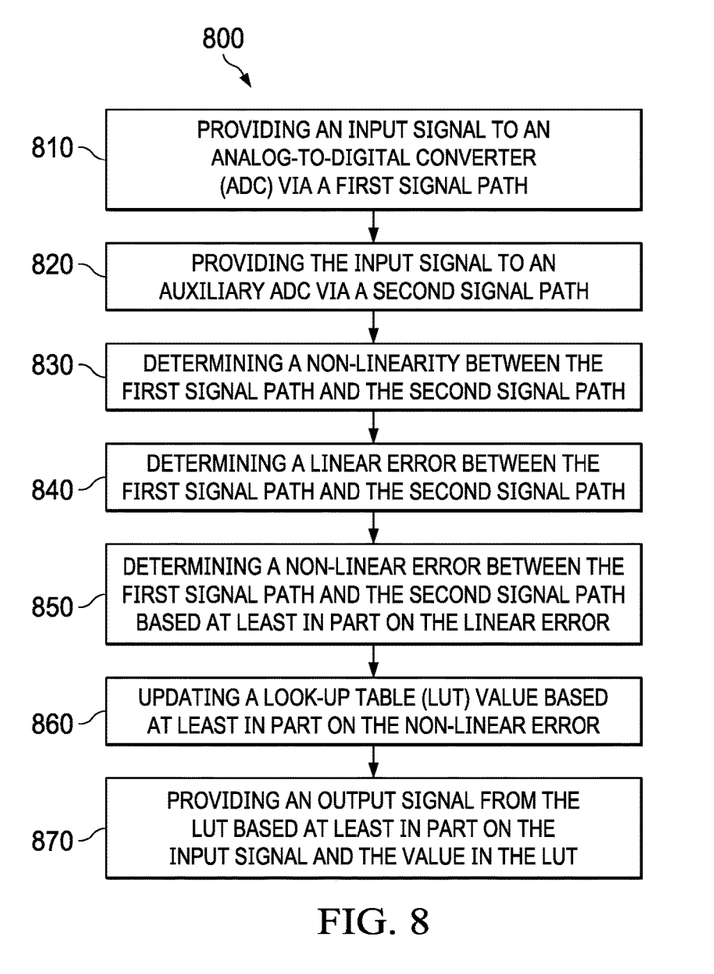
FIG. 8 is a flow diagram of a method for auxiliary ADC-based calibration for non-linearity correction of ADCs in accordance with various examples.

FIG. 8 is a flow diagram of a method 800 for auxiliary ADC-based calibration for non-linearity correction of ADCs in accordance with various examples herein. The steps of method 800 may be performed in any suitable order. The hardware components described above with respect to FIGS. 1-3 and 5-6 may perform method 800 in some examples.

Method 800 begins at 810, where an input channel (such as input channel 102) provides an input signal to an ADC via a first signal path. The ADC may be ADC 140 in an example, and the first signal path may be functional path 104.

Method 800 continues at 820, where the input channel provides the input signal to an auxiliary ADC via a second signal path. The auxiliary ADC may be a SAR ADC such as auxiliary ADC 126, and the second signal path may be a reference path 116 in an example.

Method 800 continues at 830, where a processor (such as calibration processor 128) determines a non-linearity between the first signal path and the second signal path. The non-linearity may be determined in two parts. Method 800 continues at 840, where, for the first part, the non-linearity is determined by determining a linear error between the first signal path and the second signal path. Method 800 continues at 850, where, for the second part, the non-linearity is determined by determining a non-linear error between the first signal path and the second signal path based at least in part on the linear error. Calibration processor 128 or another suitable processor may perform these determinations as described above.

Method 800 continues at 860, where calibration processor 128 updates an LUT value based at least in part on the non-linear error. LUT 142 may be updated as described above with respect to FIG. 5. In other examples, any suitable method may be useful for updated LUT 142.

Method 800 continues at 870, where an output signal is provided from LUT 142 based at least in part on the input signal and the value in LUT 142. As an example, the output signal may be provided at output 152.

Figure 9:
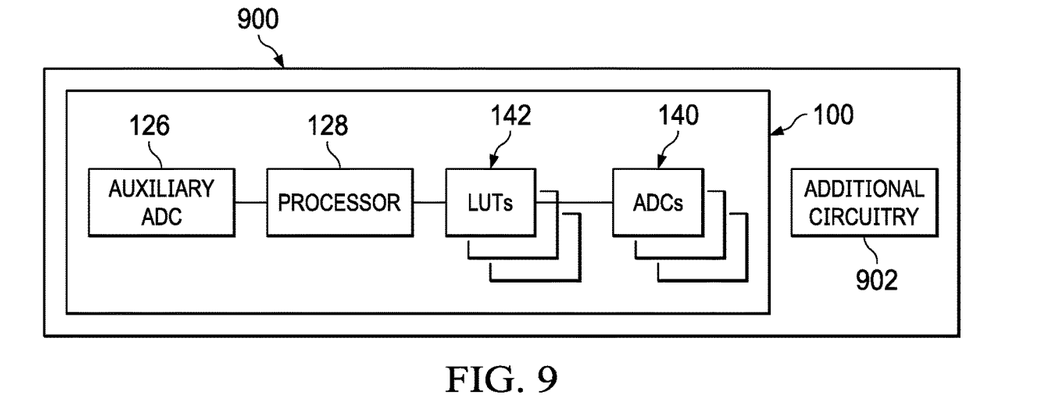
FIG. 9 is a block diagram of a device that performs auxiliary ADC-based calibration for non-linearity correction of ADCs in accordance with various examples.

FIG. 9 is a block diagram of a device 900 that performs auxiliary ADC-based calibration for non-linearity correction of ADCs in accordance with various examples herein. FIG. 9 includes the components of system 100 in FIG. 1. Only a few of the components of system 100 are shown for simplicity. In an example, device 900 may be a radio frequency (RF) transceiver with multiple transmitter and receiver chains and an RF front end. Device 900 may generate and receive wireless signals for 3G, 4G, or 5G wireless base stations. The ADCs in device 900 may include one or more ADCs 140, an LUT 142 for each ADC, a calibration processor 128, and an auxiliary ADC 126. Device 900 may be configured to perform auxiliary ADC-based calibration for non-linearity correction of ADCs as described herein. Device 900 may include any additional circuitry 902 suitable for the operation of device 900. In another example, device 900 may be any electronic device that includes high-performance ADCs and an auxiliary ADC for non-linearity corrections.

In examples herein, performance of the ADCs may be improved by correcting non-linearities. Spurs, SFDR, and/or harmonic distortion may be improved with the examples described herein. The additional ADC (e.g., the SAR ADC) consumes negligible power in an example. The additional area requirements and power impact of the hardware described herein are also small.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A system, comprising:
a voltage to delay converter (V2D) having an input and an output;
a first multiplexer having an input coupled to the output of the V2D, and an output;
a first analog-to-digital converter (ADC) having an input coupled to the output of the first multiplexer;
a second multiplexer having an input and an output;
a second auxiliary ADC having an input coupled to the output of the second multiplexer; and
calibration circuitry coupled to an output of the second ADC.

2. The system of claim 1, wherein the calibration circuitry is configured to correct a non-linearity by updating a look-up table (LUT).

3. The system of claim 2, wherein the V2D is a first V2D, and wherein the system further comprises:
a digital-to-analog converter (DAC) coupled to a second V2D, the second V2D coupled to the output of the first multiplexer, wherein the DAC is configured to calibrate the first ADC.

4. The system of claim 3, wherein the LUT is configured to map an output of the first ADC to a DAC code.

5. The system of claim 1, wherein the second ADC is a linear ADC.

6. The system of claim 1, wherein the calibration circuitry is configured to trigger the second ADC.

7. The system of claim 1, wherein an attenuator is configured to attenuate a signal provided to the second ADC.

8. A method, comprising:
providing a signal to a voltage to delay converter (V2D), wherein the V2D provides the signal to a multiplexer, and wherein the multiplexer provides the signal to a first analog-to-digital converter (ADC);
calibrating the signal by comparing an output of the first ADC to a code provided by a digital-to-analog converter (DAC) and storing a result of the comparison in a look-up table (LUT);
providing the signal to an second ADC, wherein the second ADC provides a reference signal to a calibration circuitry;

estimating a non-linearity of the signal by comparing the output of the first ADC to the reference signal; and updating the LUT based at least in part on the non-linearity.

9. The method of claim 8, wherein the second ADC is a linear ADC.

10. The method of claim 8, wherein the second ADC provides the reference signal to the calibration circuitry responsive to a trigger from the calibration circuitry.

11. The method of claim 8, wherein estimating the non-linearity of the signal includes:
determining a linear error between the output of the first ADC and the reference signal; and
determining a non-linear error between the output of the first ADC and the reference signal based at least in part on the linear error.

12. The method of claim 11, further comprising:
determining the non-linear error with a basis-spline function.

13. The method of claim 11, further comprising:
removing a linear portion of the non-linear error.

14. A method, comprising:
determining a non-linearity between a first signal path and a second signal path by:
determining a linear error between the first signal path and the second signal path; and
determining a non-linear error between the first signal path and the second signal path based at least in part on the linear error;
updating a look-up table (LUT) value based at least in part on the non-linear error; and
providing an output signal from the LUT based at least in part on the input signal and the value in the LUT.

15. The method of claim 14, wherein the first ADC is a delay domain ADC.

16. The method of claim 14, wherein determining the linear error further comprises:
removing a channel offset prior to computing a matrix inverse.

17. The method of claim 14, wherein the linear error is determined based at least in part on a gain of the second signal path.

18. The method of claim 14, wherein the linear error is determined based at least in part on a previous input signal on the first signal path and a time derivative of a current input signal on the first signal path.

19. The method of claim 14, further comprising:
determining the non-linear error with a basis-spline function.

20. The method of claim 14, wherein the LUT includes calibration data of the first ADC.

* * * * *